US012593566B2

(12) United States Patent
Xing et al.

(10) Patent No.: US 12,593,566 B2
(45) Date of Patent: Mar. 31, 2026

(54) DISPLAY SCREEN, DISPLAY DEVICE AND METHOD OF MANUFACTURING DISPLAY SCREEN

(71) Applicant: YUNGU (GU'AN) TECHNOLOGY CO., LTD., Langfang (CN)

(72) Inventors: Rubo Xing, Langfang (CN); Rusheng Liu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 649 days.

(21) Appl. No.: 17/991,006

(22) Filed: Nov. 21, 2022

(65) Prior Publication Data

US 2023/0085073 A1 Mar. 16, 2023

Related U.S. Application Data

(63) Continuation of application No. PCT/CN2021/108335, filed on Jul. 26, 2021.

(30) Foreign Application Priority Data

Oct. 13, 2020 (CN) .......................... 202011090538.8

(51) Int. Cl.
*H10K 59/122* (2023.01)
*H10K 50/828* (2023.01)
(Continued)

(52) U.S. Cl.
CPC ......... *H10K 59/122* (2023.02); *H10K 50/828* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | |
|---|---|---|
| 2009/0236962 A1 | 9/2009 | Fujimoto et al. |
| 2015/0060826 A1* | 3/2015 | Matsumoto .......... H10K 59/122 |
| | | 438/34 |
| 2019/0103442 A1* | 4/2019 | Choi ................ H10K 59/80521 |

FOREIGN PATENT DOCUMENTS

| | | |
|---|---|---|
| CN | 1838843 A | 9/2006 |
| CN | 104335679 A | 2/2015 |
| | (Continued) | |

OTHER PUBLICATIONS

Notice of Allowance issued on Dec. 12, 2022, in corresponding Chinese Application No. 202011090538.8, 11 pages.

(Continued)

*Primary Examiner* — Michelle Mandala
(74) *Attorney, Agent, or Firm* — Maier & Maier, PLLC

(57) ABSTRACT

The present application provides a display screen, a display device and a method of manufacturing the display screen, and relates the field of display technology. The display screen includes an array substrate, an anode layer, a light-emitting layer and a cathode layer which are stacked in sequence; the light-emitting layer includes a plurality of light-emitting units and a pixel definition layer separating the light-emitting units from each other, and the pixel definition layer is a transparent layer; the cathode layer is provided with a hollow-out area corresponding to the pixel definition layer, the hollow-out area has a semitransparent portion and a light transmitting portion penetrating through the cathode layer. The present application can improve the transmittance of the cathode layer corresponding to the pixel definition layer by disposing the light transmitting portion, thereby improving an effect of the photosensitive element acquiring an image.

8 Claims, 10 Drawing Sheets

(51) Int. Cl.
    *H10K 59/12*    (2023.01)
    *H10K 71/00*    (2023.01)

(56)            References Cited

FOREIGN PATENT DOCUMENTS

| | | | |
|---|---|---|---|
| CN | 108258024 | A | 7/2018 |
| CN | 110416272 | A | 11/2019 |
| CN | 110854176 | A | 2/2020 |
| CN | 110867527 | A | 3/2020 |
| CN | 111009619 | A | 4/2020 |
| CN | 111640882 | A | 9/2020 |
| CN | 112201761 | A | 1/2021 |
| TW | I280069 | B | 4/2007 |

OTHER PUBLICATIONS

International Search Report and Written Opinion issued on Oct. 13, 2020, in corresponding International Application No. PCT/CN2021/108335, 14 pages.
Office Action issued on Jan. 28, 2022, in corresponding Chinese Application No. 202011090538.8, 12 pages.
Office Action issued on Jul. 15, 2022, in corresponding Chinese Application No. 202011090538.8, 8 pages.

\* cited by examiner

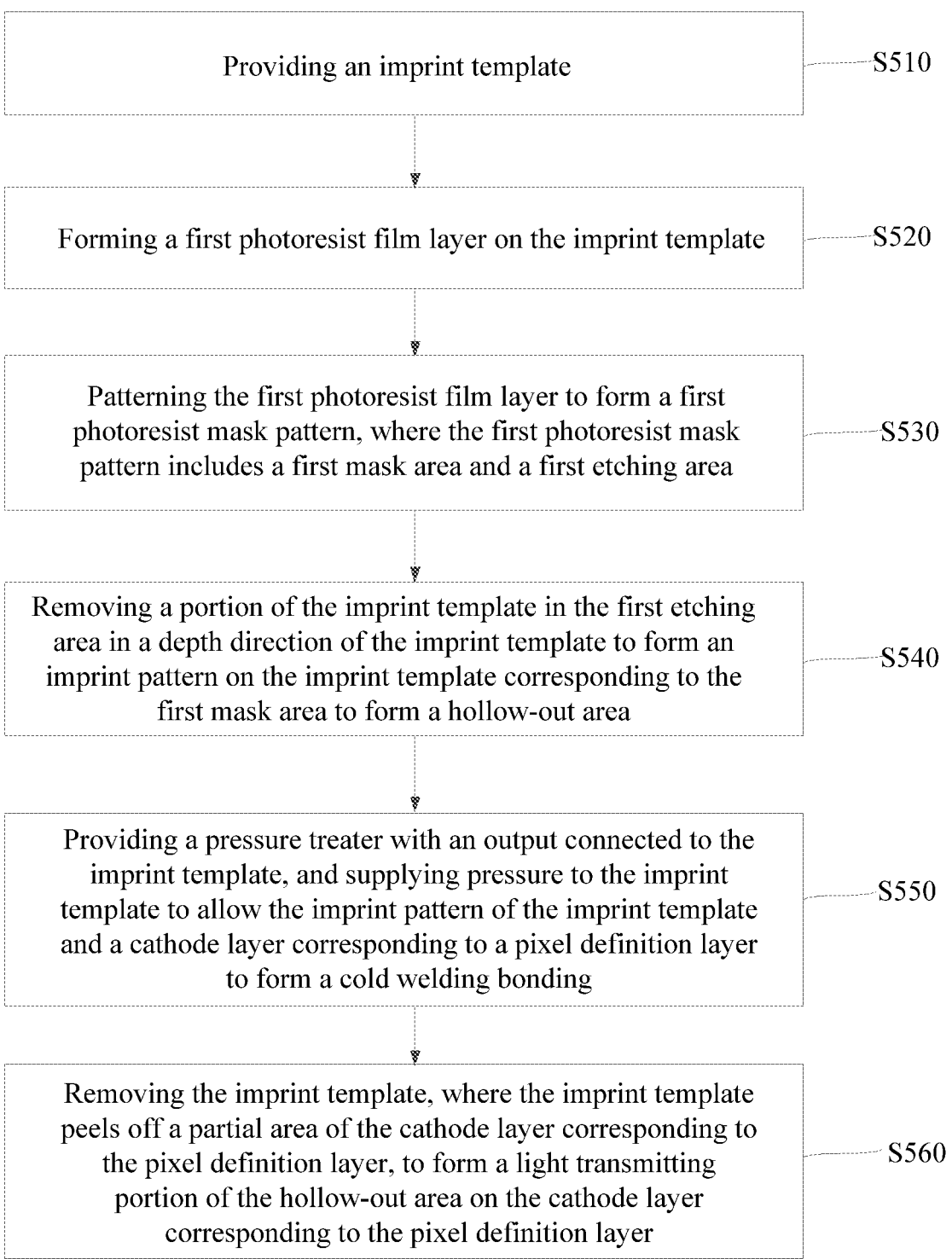

Providing an imprint template — S510

Forming a first photoresist film layer on the imprint template — S520

Patterning the first photoresist film layer to form a first photoresist mask pattern, where the first photoresist mask pattern includes a first mask area and a first etching area — S530

Removing a portion of the imprint template in the first etching area in a depth direction of the imprint template to form an imprint pattern on the imprint template corresponding to the first mask area to form a hollow-out area — S540

Providing a pressure treater with an output connected to the imprint template, and supplying pressure to the imprint template to allow the imprint pattern of the imprint template and a cathode layer corresponding to a pixel definition layer to form a cold welding bonding — S550

Removing the imprint template, where the imprint template peels off a partial area of the cathode layer corresponding to the pixel definition layer, to form a light transmitting portion of the hollow-out area on the cathode layer corresponding to the pixel definition layer — S560

FIG. 7

DISPLAY SCREEN, DISPLAY DEVICE AND METHOD OF MANUFACTURING DISPLAY SCREEN

CROSS-REFERENCE TO RELATED APPLICATIONS

The present application is a continuation of International Application No. PCT/CN2021/108335, filed on Jul. 26, 2021, which claims priority to Chinese Patent Application No. 202011090538.8, filed with China National Intellectual Property Administration on Oct. 13, 2020, and entitled "DISPLAY SCREEN, DISPLAY DEVICE AND METHOD OF MANUFACTURING DISPLAY SCREEN". The entire content of the aforementioned applications is incorporated in the present application by reference.

TECHNICAL FIELD

The present application relates to the field of display technology and, in particular to a display screen, a display device, and a method of manufacturing the display screen.

BACKGROUND

With a rapid development of display technology, a full-screen display has become a development trend of an electronic device such as a mobile phone. In order to realize the full-screen display, it is usually necessary to dispose a camera below a display screen of the electronic device, thereby forming an under-screen camera.

An organic light-emitting diode (OLED) display screen usually includes an array substrate, an anode layer, a light-emitting layer, and a cathode layer which are stacked in sequence, where the light-emitting layer includes a plurality of light-emitting units and a pixel definition layer separating the light-emitting units from each other. Since the pixel definition layer does not emit light, in order to improve the transmittance of the cathode layer, a scraper or other tools would be usually used to remove a portion of the cathode layer corresponding to the pixel definition layer, so that a plurality of strip-shaped through holes distributed at intervals are formed on the cathode layer.

Although the above way may increase the transmittance of the cathode layer, and accordingly also may increase a diffraction rate of light, which reduces an effect of photosensitive elements such as the under-screen camera acquiring an image.

SUMMARY

In view of the above problems, the embodiments of the present application provide a display screen, a display device and a method of manufacturing the display screen, which may reduce a diffraction rate of light emitted to a photosensitive element, and improve an effect of the photosensitive element acquiring an image, while improving a transmittance of the cathode layer. In order to achieve the above purposes, in a first aspect of the embodiments of the present application, there is provided a display screen, including: an array substrate, an anode layer, a light-emitting layer and a cathode layer which are stacked in sequence; the light-emitting layer includes a plurality of light-emitting units and a pixel definition layer separating the light-emitting units from each other, and the pixel definition layer is a transparent layer; the cathode layer is provided with a hollow-out area corresponding to the pixel definition layer, the hollow-out area has a semitransparent portion and a light transmitting portion penetrating through the cathode layer, and the light transmitting portion is configured for light emitted to a photosensitive element to pass through, and the semitransparent portion is configured to prevent diffraction generated when light emitted to the photosensitive element passes through the hollow-out area.

In a second aspect of the embodiments of the present application, there is provided a display device, including the display screen as described above and a photosensitive element located below the display screen, and the hollow-out area in the display screen corresponds to the photosensitive element.

In a third aspect of the embodiments of the present application, there is provided a method of manufacturing a display screen, including:

providing an array substrate;

forming an anode layer on the array substrate;

forming a light-emitting layer on the anode layer, the light-emitting layer including a plurality of light-emitting units and a pixel definition layer separating light-emitting units from each other;

forming a cathode layer on the light-emitting layer;

removing a partial area of the cathode layer to form a light transmitting portion penetrating through the cathode layer, where a semitransparent portion is formed between adjacent light transmitting portions, and the light transmitting portion and the semitransparent portion form a hollow-out area corresponding to the pixel definition layer.

In the method of manufacturing a display screen as describe above, the step of removing the partial area of the cathode layer to form the light transmitting portion penetrating through the cathode layer, wherein a semitransparent portion is formed between adjacent light transmitting portions, and the light transmitting portion and the semitransparent portion form the hollow-out area corresponding to the pixel definition layer, including:

providing an imprint template;

forming a first photoresist film layer on the imprint template;

patterning the first photoresist film layer to form a first photoresist mask pattern, the first photoresist mask pattern including a first mask area and a first etching area;

removing a portion of the imprint template in the first etching area in a depth direction of the imprint template to form an imprint pattern on the imprint template corresponding to the first mask area to form the hollow-out area.

In the display screen, the display device and the method of manufacturing the display screen provided in the embodiments of the present application, the cathode layer corresponding to the pixel definition layer is disposed as the hollow-out area, and the light transmitting portion is provided in the hollow-out area, so that the transmittance of the cathode layer corresponding to the pixel definition layer may be improved, and light loss caused by light emitted to the photosensitive element when passing through the cathode layer corresponding to the pixel definition layer is reduced, thereby improving an effect of the photosensitive element acquiring the image.

In addition, the hollow-out area also has the semitransparent portion which prevents light emitted by adjacent light-emitting units from passing through the semitransparent portion of the hollow-out area, the adjacent light transmitting portions are separated by use of the semitransparent portion, so that light emitted to the photosensitive element is less likely to produce a constructive phase or amplitude, thereby ensuring that when light emitted to the photosensitive element passes through the hollow-out area, the situation of the constructive phase or amplitude is greatly reduced, which may avoid the superposition of phases, weaken the occurrence of the diffraction phenomenon, and then improve the effect of the photosensitive element acquiring the image.

BRIEF DESCRIPTION OF THE DRAWINGS

FIG. 7 is Flow Chart 2 of the display screen provided in Embodiment 3 of the present application.

DETAILED DESCRIPTION OF THE EMBODIMENTS

Figure 1:
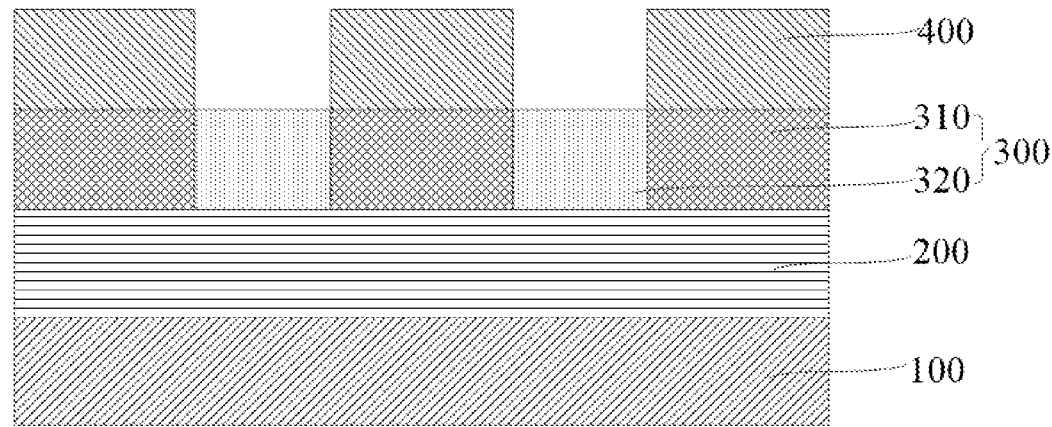
FIG. 1 is a structural schematic diagram of a display screen.
Figure 2:
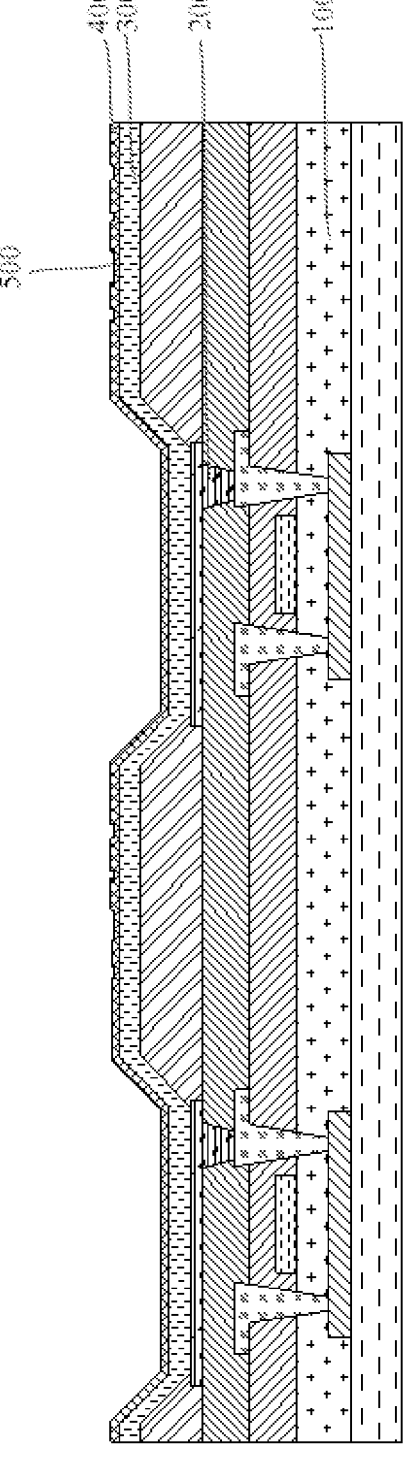
FIG. 2 is a structural schematic diagram of a display screen provided in Embodiment 1 of the present application.

As shown in FIG. 1, since a cathode layer 400 of a display screen is a metal layer, in order to improve the transmittance of light, the cathode layer 400 corresponding to a pixel definition layer 320 is usually removed, so that the pixel definition layer 320 is exposed, in this way, a plurality of strip-shaped through holes distributed at intervals are formed on the cathode layer 400. When light directed at a photosensitive element passes through the regular strip-shaped through holes, diffraction may occur, thereby reducing an effect of the photosensitive element acquiring an image.

In view of the above problems, in a display screen, a display device and a method of manufacturing the display screen provided in embodiments of the present application, a cathode layer corresponding to a pixel definition layer is configured to be a hollow-out area, and a light transmitting portion is provided in the hollow-out area, in this way, the transmittance of the cathode layer corresponding to the pixel definition layer may be improved, and light loss caused by light directed at a photosensitive element when passing through the cathode layer corresponding to the pixel definition layer is reduced, thereby improving an effect of the photosensitive element acquiring the image.

At the same time, the hollow-out area has a semitransparent portion which blocks light emitted by adjacent light-emitting units from passing through the hollow-out area, the adjacent light transmitting portions are separated by the semitransparent portion, so that light directed to the photosensitive element is not easy to produce a constructive phase or amplitude, thereby ensuring that when light emitted to the photosensitive element passes through the hollow-out area, the situation of the constructive phase or amplitude is greatly reduced, which may avoid the superposition of phases, weaken the occurrence of the diffraction phenomenon, and then improve the effect of the photosensitive element acquiring the image.

In order to make the above purposes, features and advantages of the embodiments of the present application more obvious and easy to understand, the technical solutions in the embodiments of the present application will be described clearly and completely below in conjunction with the accompanying drawings in the embodiments of the present application.

As shown in FIG. 2 to FIG. 5, in an embodiment of the present application, the display screen includes an array substrate 100, an anode layer 200, a light-emitting layer 300, and a cathode layer 400 which are stacked in sequence.

The array substrate 100 is configured to support elements disposed thereon as a bearing part of the display screen, and to control a current or voltage of the elements disposed thereon.

Where, the array substrate 100 may include a base, a thin film transistor (abbreviated as TFT) array layer disposed on the base and a planarization layer disposed on the TFT array layer, etc., and the base may be a rigid base, such as a glass base, a plastic base, and may also be a flexible base, such as a flexible base including polyimide (abbreviated as PI).

The anode layer 200, the light-emitting layer 300 and the cathode layer 400 are sequentially disposed on a planarization layer of the array substrate 100, where the anode layer 200 is located on the array substrate 100 for generating holes, the cathode layer 400 is used to generate electrons, and the light-emitting layer 300 is located between the anode layer 200 and the cathode layer 400. The electrons generated by the cathode layer 400 and holes generated by the anode layer 200 form electron-hole pairs, i.e., excitons, by complexing in the light-emitting layer, where the excitons may transfer energy to a light emission material in the light-emitting layer 300, such that the light emission material emits light.

The light-emitting layer 300 includes a light-emitting unit 310 and a pixel definition layer 320, where the light-emitting unit 310 may emit light and the pixel definition layer 320 is configured to isolate the light-emitting unit 310, thereby defining a light-emitting area. In order to ensure a normal operation of a photosensitive element, in the embodiment of the present application, the pixel definition layer 320 is disposed as a transparent layer, so that light can be transmitted to the photosensitive element under the display screen through the pixel definition layer 320, so that the photosensitive element can acquire an image.

The cathode layer 400 is provided with a hollow-out area 500, and the hollow-out area 500 corresponds to the pixel definition layer 320, so that the transmittance of light emitted to the photosensitive element when passing through the cathode layer 400 may be improved, thereby improving an effect of the photosensitive element acquiring an image. Where the photosensitive element is a camera, a sensor and other devices with a biometric recognition capability, and the devices with biometric recognition capability may be configured for fingerprint identification, palmprint identification or face identification.

Figure 5:
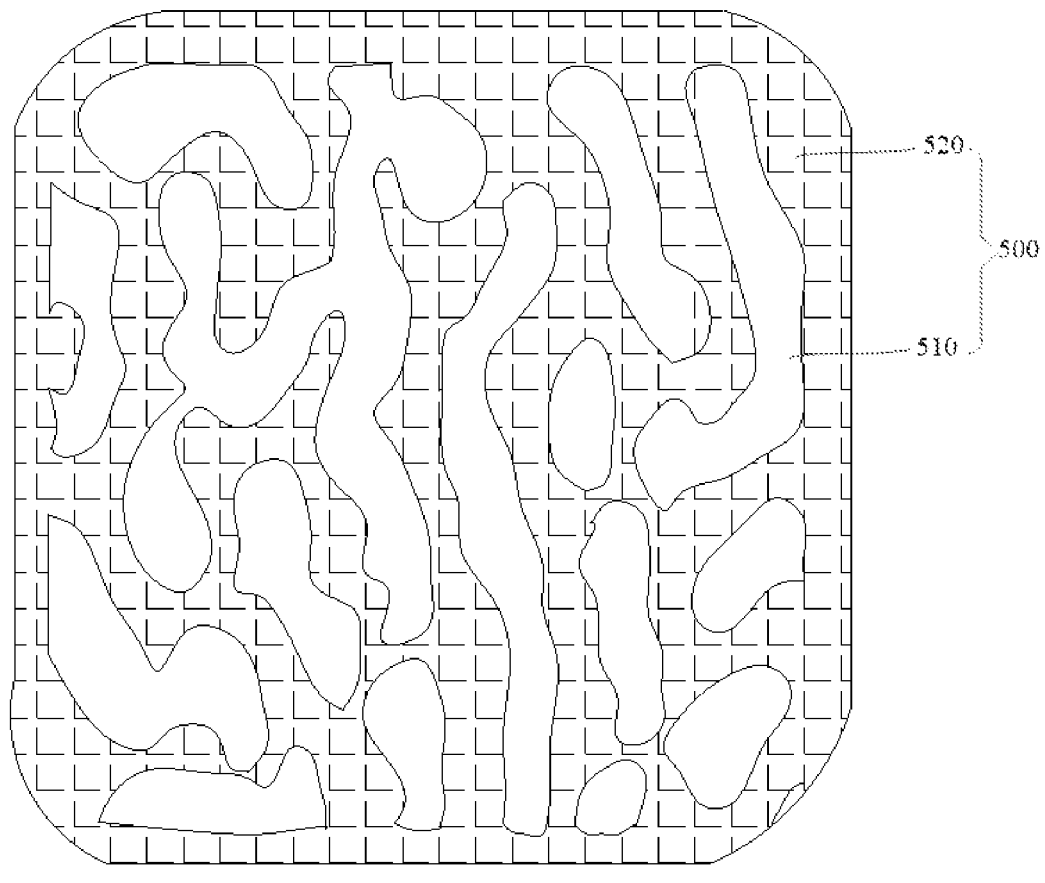
FIG. 5 is a top view of a hollow-out area provided in Embodiment 1 of the present application.

As shown in FIG. 5, the hollow-out area 500 has a light transmitting portion 510 and a semitransparent portion 520, and the light transmitting portion 510 penetrates through the cathode layer 400 and may be used for light emitted to the photosensitive element to pass through. The semitransparent portion 520 retains the initial structure of the cathode layer for reducing the diffraction of light emitted to the photosensitive element through the hollow region 500.

It is to be noted that, the semitransparent portion 520 may refer to the original structure of the cathode layer 400, that is, a portion of the hollow-out area 500 in the cathode layer 400 excluding the light transmitting portion 510. Moreover, since the transmittance of the portion of the hollow region 500 in the cathode layer 400 excluding the light transmitting portion 510 is lower than that of the light transmitting portion 510, this portion is defined as the semitransparent portion 520.

That is, in an area of the cathode layer 400 corresponding to the pixel definition layer 320, one partial area of the cathode layer may be completely removed by a scraper or other tools to form the light transmitting portion 510 penetrating through the cathode layer 400. Accordingly, another partial area of the cathode layer, i.e., the portion excluding the light transmitting portion penetrating through the cathode layer, forms the semitransparent portion 520.

In this embodiment, the hollow-out area 500 corresponds to the pixel definition layer 320, and the pixel definition layer 320 is configured to isolate respective light-emitting units 310. Therefore, when the light-emitting units 310 are arranged in an array, the pixel definition layer 320 is also arranged in an array, accordingly, the hollow-out area 500 may correspond to one row or one column of the pixel definition layer 320.

Figure 3:
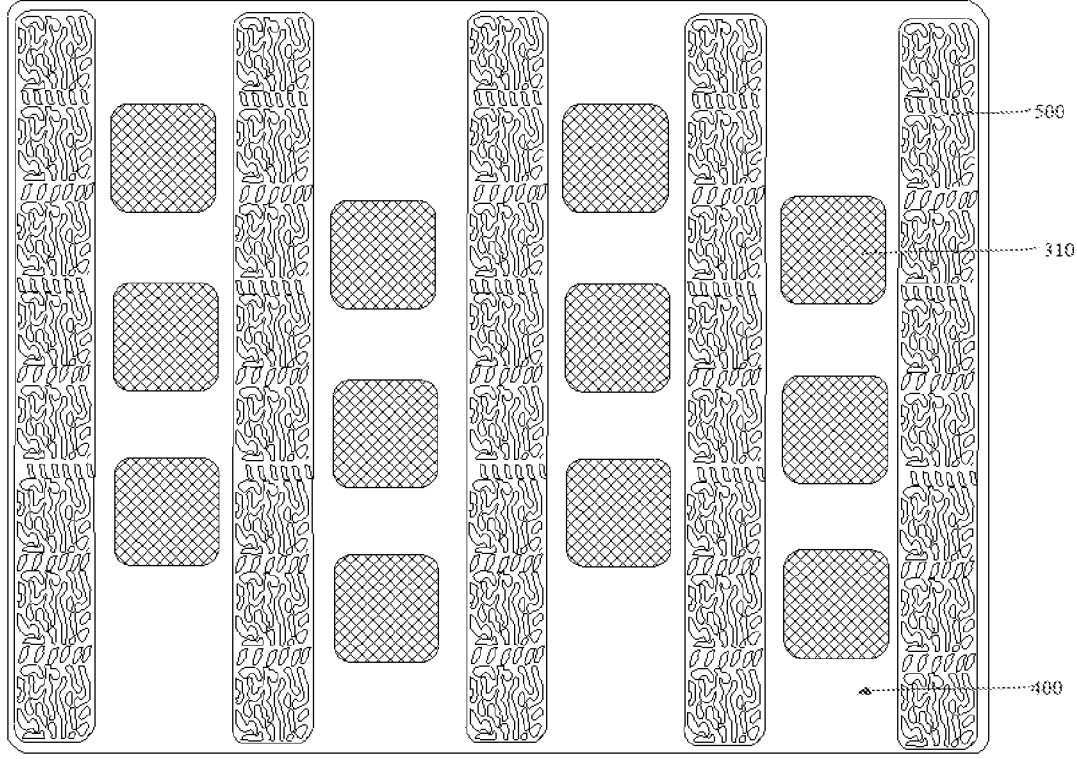
FIG. 3 is a top view of a display screen provided in Embodiment 1 of the present application.
Figure 4:
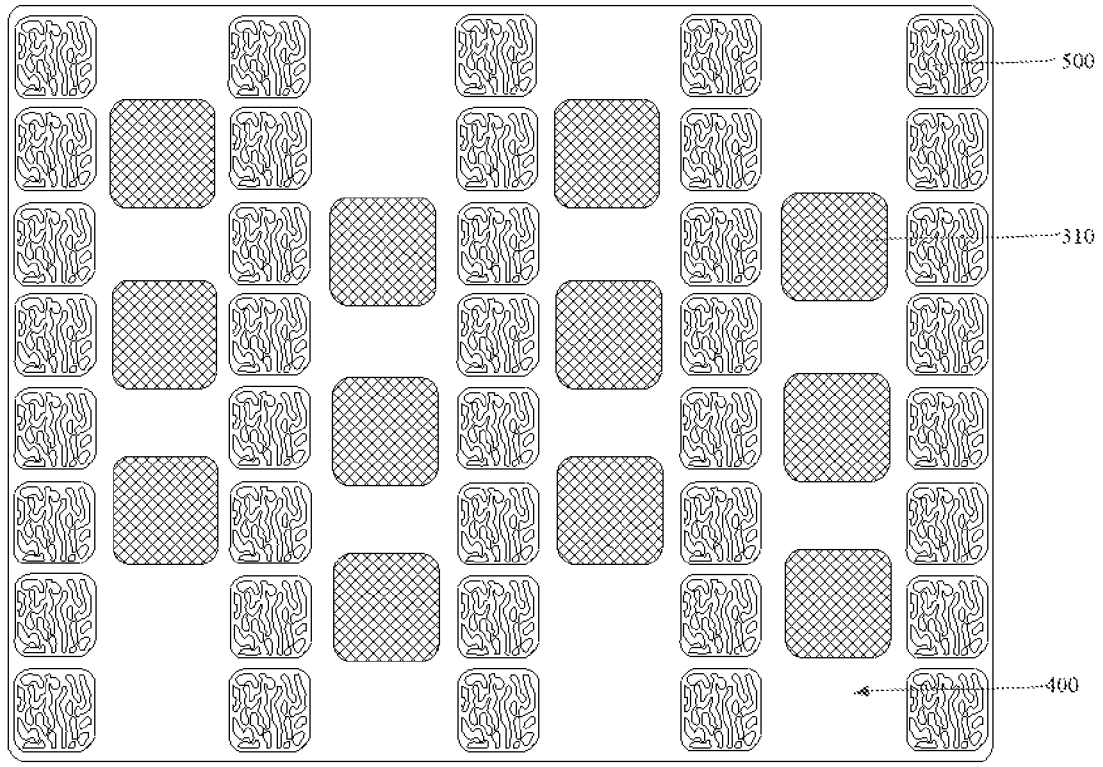
FIG. 4 is another top view of a display screen provided in Embodiment 1 of the present application.

For example, as shown in FIG. 3, the display screen may include five columns of the pixel definition layers 320, and a column of light-emitting units 310 is disposed between two adjacent columns of the pixel definition layer 320. Accordingly, the cathode layer 400 corresponding to each column of the pixel definition layer 320 is disposed as the hollow-out area 500, where a projection area of the hollow-out area 500 on the pixel definition layer 320 may be substantially equal to that of the pixel definition layer 320; it may also be that the projection area of the hollow-out area 500 on the pixel definition layer 320 is smaller than that of the pixel definition layer 320 as shown in FIG. 4. That is, the hollow-out area 500 may include a plurality of hollow-out subareas disposed at intervals, and each hollow-out subarea has a light transmitting portion 510 and a semitransparent portion 520.

In this embodiment, the cathode layer 400 corresponding to the pixel definition layer 320 is disposed as a structure with the hollow-out area 500, and the light transmitting portion 510 is provided in the hollow-out area 500, so that the transmittance of the cathode layer corresponding to the pixel definition layer may be improved, and the light loss caused by light emitted to the photosensitive element passing through the cathode layer corresponding to the pixel definition layer is reduced, thereby improving the effect of the photosensitive element acquiring the image.

In addition, the hollow-out area 500 also has the semitransparent portion 520 that blocks light emitted by the adjacent light-emitting units from passing through the hollow-out area, and the adjacent light transmitting portions 510 are separated by the semitransparent portion 520, so that light emitted to the photosensitive element is not easy to show constructive phase or amplitude, thereby ensuring that when the light emitted to the photosensitive element passes through the hollow-out area, the situation of constructive phase or amplitude is greatly reduced, which may avoid phase superposition, weaken the occurrence of the diffraction phenomenon, and improve the effect the photosensitive element acquiring the image.

The light transmitting portion 510 is composed of a plurality of through holes penetrating the cathode layer, and the plurality of through holes are irregularly arranged in the hollow region 500, and the semitransparent portion 520 is formed between the through holes.

As shown in FIG. 5, in this embodiment, the plurality of through holes are irregularly arranged in the hollow-out area 500, and it is not that the plurality of through holes are arranged in an array in the hollow-out area, so that the proportions of the through holes per unit area are different. Accordingly, it is less likely that light emitted to the photosensitive element has a situation of constructive phase or amplitude, so as to ensure that when light emitted to the photosensitive element passes through the hollow-out area, the situation of constructive phase or amplitude is greatly reduced, which may avoid the superposition of phases, weaken the occurrence of the diffraction phenomenon, and improve the effect of the photosensitive element acquiring the image.

Further, the through holes are slits that penetrate through the cathode layer, and the slits have different width, that is, each through hole is in an irregular shape, As shown in FIG. 5, the width of the slit is large at some places, and is small at some other places, and an axis of the slit does not form a specific included angle with a length direction or a width direction of the hollow-out area 500. In this way, the more irregular the shape of the through hole, the less likely light emitted to the photosensitive element exhibits constructive interference or destructive interference, thereby ensuring that when light emitted to the photosensitive element passes through the hollow-out area, the occurrence of diffraction, constructive interference and destructive interference is greatly reduced, and the superposition of phases is avoided as much as possible, which weakens the occurrence of a diffraction phenomenon, and then improves the effect of the photosensitive element acquiring the image.

In addition, the display screen may also include an encapsulation layer, the encapsulation layer may be disposed over and cover the cathode layer 400. For example, the encapsulation layer and the cathode layer 400 may be connected to each other by means of encapsulation glue, and the encapsulation layer is configured to encapsulate the array substrate 100 and the light-emitting layer 300 so as to prevent water, oxygen, dust and rays from entering the light-emitting layer 300, thereby ensuring the reliable operation of the display screen.

The encapsulation layer may be an inorganic thin film, such as a silicon nitride film; it may also be an organic thin film, such as a polymeric thin film. In addition, in order to ensure the transparency of the encapsulation layer, the encapsulation layer may also be made of a transparent material.

In an embodiment of the present application, there is also provided a display device which includes the display screen in the above-mentioned embodiments and a photosensitive element located on a back of the display screen, where the hollow-out area 500 in the display screen corresponds to the photosensitive element.

Where the display device may be applied to a smart phone, a tablet computer, a notebook computer, and a mobile terminal with a display screen or other terminal device. The photosensitive element is a camera, a sensor, and other devices with biometric recognition capability, and the devices with biometric recognition capability may be used for fingerprint identification, palmprint identification or face identification.

In this embodiment, since the display device includes the display screen described in the above-mentioned embodiment, the display device also has the same advantages as the above-mentioned display screen, and specific reference may be made to the relevant description, which would not be repeated here.

In this embodiment, the cathode layer 400 corresponding to the pixel definition layer is set as the hollow-out area 500, and light transmitting portions 510 are provided in the hollow-out area 500, so that the transmittance of the cathode layer 400 corresponding to the pixel definition layer 320 may be improved, the light loss caused by light emitted to the photosensitive element when passing through the cathode layer 400 corresponding to the pixel definition layer 320 is reduced, thereby improving the effect of the photosensitive element acquiring the image.

In addition, the hollow-out area 500 also has the semitransparent portion 520, and adjacent light transmitting portions are separated by the semitransparent portion 520, so that light emitted to the photosensitive element is not easy to produce a constructive phase or amplitude, thereby ensuring that when light emitted to the photosensitive element passes through the hollow-out area, the situation of the constructive phase or amplitude is greatly reduced, which may avoid the superposition of phases, weaken the occurrence of the diffraction phenomenon, and then improve the effect of the photosensitive element acquiring the image.

Figure 6:
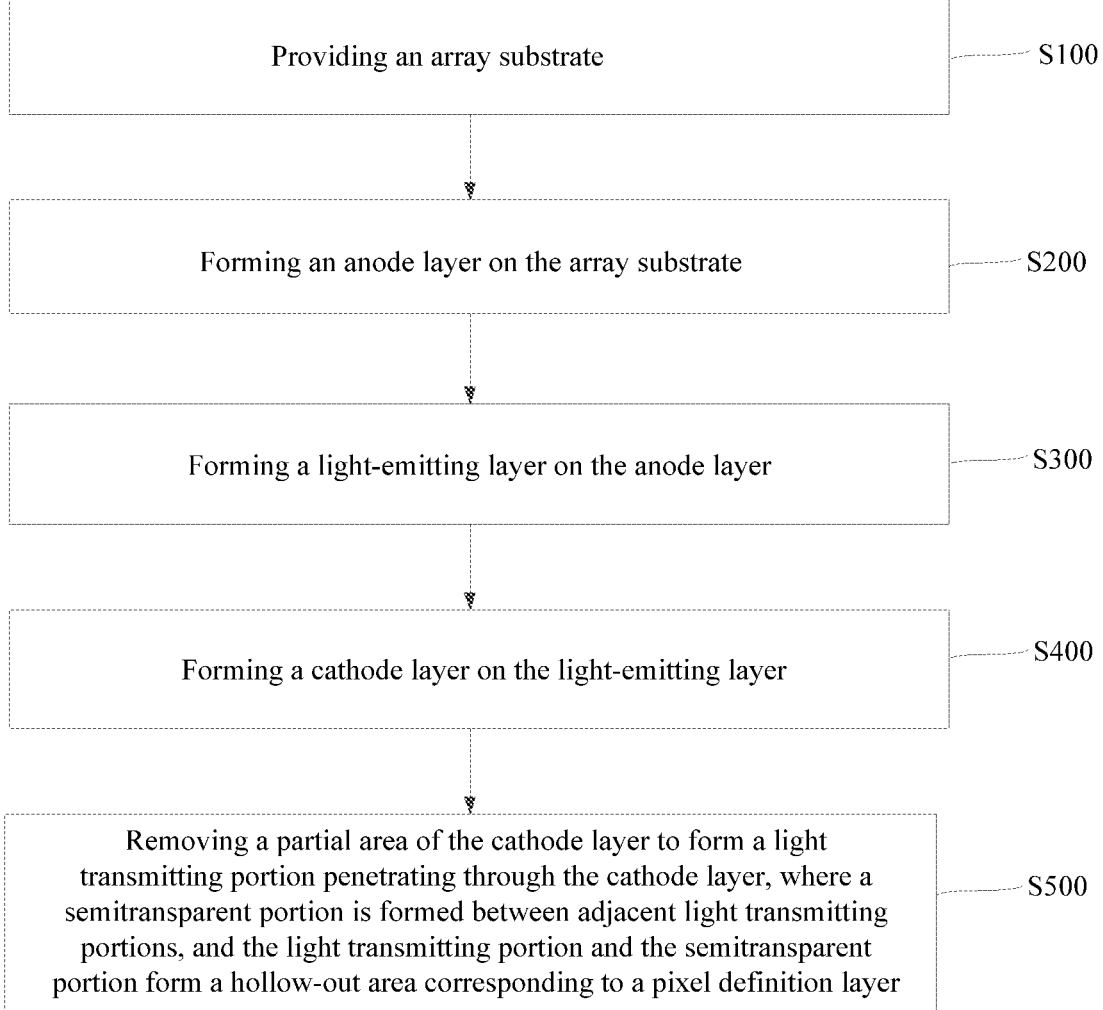
FIG. 6 is Flow Chart 1 of a display screen provided in Embodiment 3 of the present application.

As shown in FIG. 6, in an embodiment of the present application, there is provided a method of manufacturing the above-mentioned display screen, including the following steps:

S100: providing an array substrate.

S200: forming an anode layer on the array substrate.

The anode layer is formed on a planarization layer of the array substrate by a process such as deposition, evaporation or sputtering; the anode layer generally includes a plurality of anode blocks arranged in an array, and each anode block is connected to a source or a drain in a TFT array layer by a via-hole formed in the planarization layer.

S300: forming a light-emitting layer on the anode layer, where the light-emitting layer includes a plurality of light-emitting units and a pixel definition layer separating the light-emitting units from each other; where the pixel definition layer is a transparent layer.

In this step, the pixel definition layer 320 may be formed on the anode layer 200 first, a plurality of openings may be formed in the pixel definition layer through a patterning process, and then an organic light-emitting material is deposited in the openings by evaporation through a mask to form the light-emitting layer within the openings.

S400: forming a cathode layer on the light-emitting layer.

A cathode material, such as aluminum or aluminum-magnesium alloy, etc., is deposited on the light-emitting layer by means of evaporation.

S500: removing a partial area of the cathode layer to form a light transmitting portion penetrating through the cathode layer, where a semitransparent portion is formed between adjacent light transmitting portions, and the light transmitting portion and the semitransparent portion form a hollow-out area corresponding to the pixel definition layer.

In this step, a scraper or other tools may be used to remove a partial area of the cathode layer 400, so that the removed area forms the light transmitting portion 510, and when the partial area removed is multiple, the semitransparent portion 520 is formed between adjacent light transmitting portions 510, and a plurality of light transmitting portions 510 and a plurality of semitransparent portions 520 may form the hollow-out area 500, and the hollow-out area 500 corresponds to the pixel definition layer 320.

Where the light transmitting portion 510 is used for the light emitted to the photosensitive element to pass through, so that the transmittance of the cathode layer corresponding to the pixel definition layer may be improved, and the light loss caused by light emitted to the photosensitive element when passing through the cathode layer corresponding to the pixel definition layer is reduced, thereby improving the effect of the photosensitive element acquiring the image.

In addition, the semitransparent portion 520 is configured to block light emitted by the adjacent light-emitting units from passing through the hollow-out area, and the adjacent light transmitting portions are separated by the semitransparent portion, so that the light emitted to the photosensitive element is less likely to have a constructive phase or amplitude, thereby ensuring that when the light emitted to the photosensitive element passes through the hollow-out area, the situation of the constructive phase or amplitude is greatly reduced. In this way, the superposition of phases may be avoided, and the diffraction phenomenon may be weakened, and then the effect of the photosensitive element acquiring the image may be improved.

Figure 9:
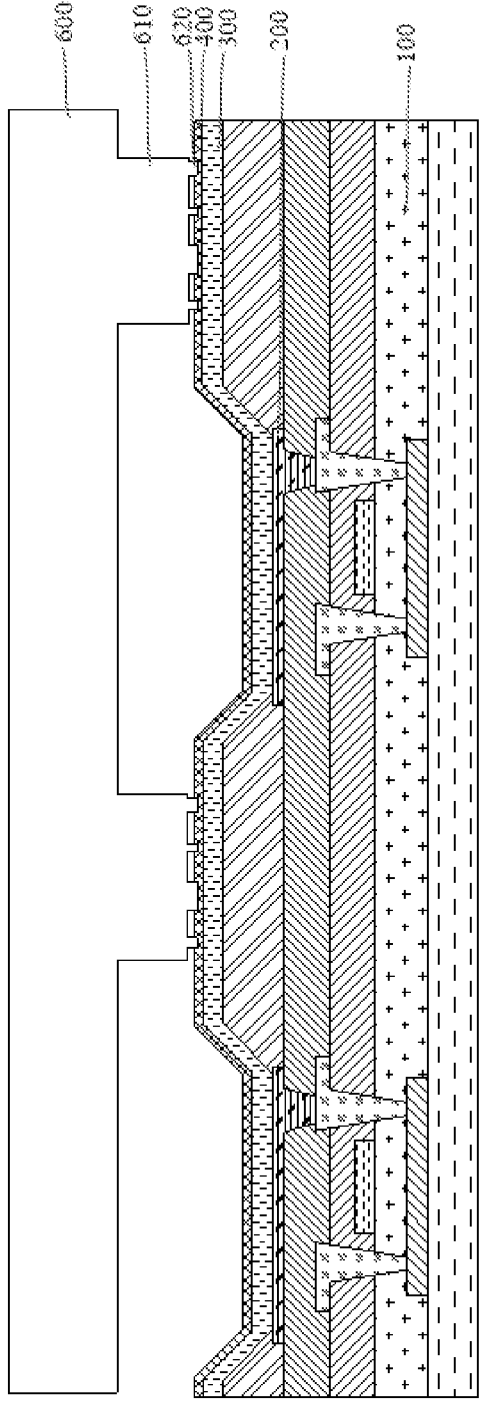
FIG. 9 is an initial state diagram of a method of manufacturing the display screen provided in Embodiment 3 of the present application.
Figure 10:
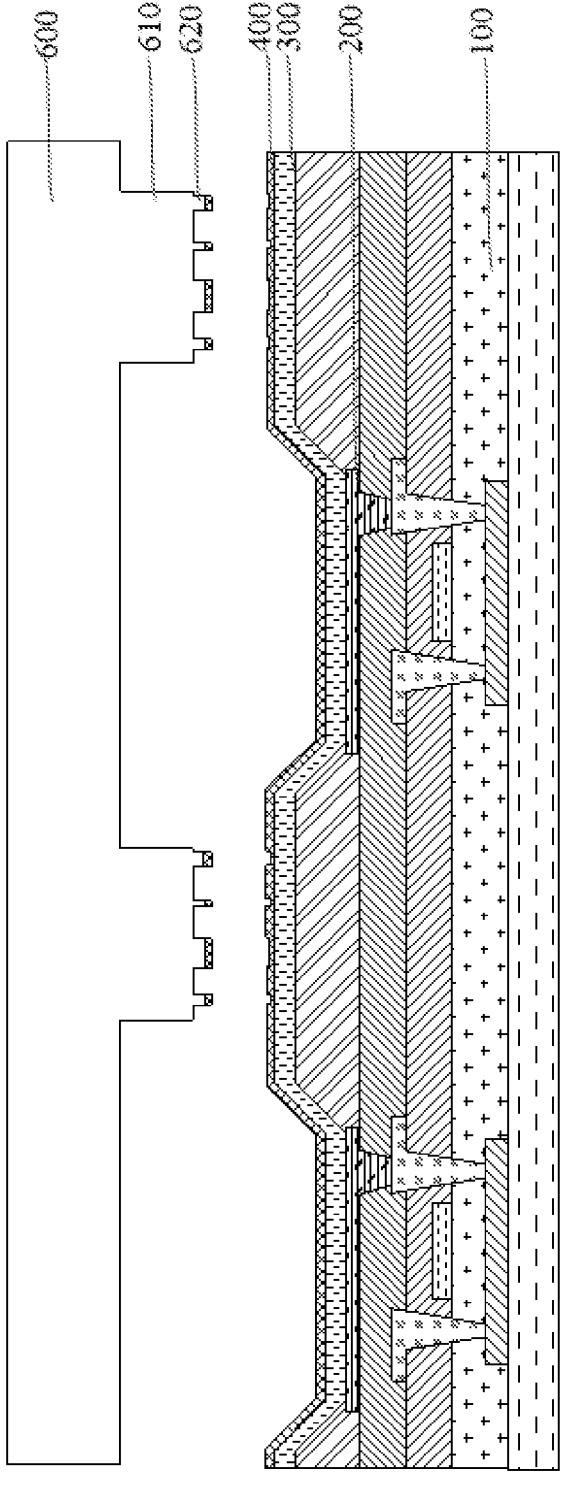
FIG. 10 is a final state diagram of a method of manufacturing the display screen provided in Embodiment 3 of the present application.

As shown in FIG. 7, FIG. 9 and FIG. 10, in some embodiments, the step of removing a partial area of the cathode layer to form a light transmitting portion penetrating through the cathode layer, where a semitransparent portion is formed between adjacent light transmitting portions, and the light transmitting portion and the semitransparent portion form a hollow-out area corresponding to a pixel definition layer includes the following.

S510: providing an imprint template.

Where the imprint template 600 may be made of one of silicon, silicon compound and metal.

S520: forming a first photoresist film layer on the imprint template.

The first photoresist film layer may be formed on the imprint template by a coating-curing process, an inkjet printing process or a deposition process, that is, the first photoresist film layer covers a lower surface of the imprint template.

S530: patterning the first photoresist film to form a first photoresist mask pattern, where the first photoresist mask pattern includes a first mask area and a first etching area.

By a patterning processing mode such as masking, exposure, developing, etching, etc., the first photoresist film is patterned to form the first photoresist mask pattern.

S540: removing a portion of the imprint template in the first etching area in a depth direction of the imprint template to form an imprint pattern on the imprint template corresponding to the first mask area to form the hollow-out area.

In an alternative implementation, step S540 may include step S541, that is removing the portion of the imprint template corresponding to the first etching area in the depth direction of the imprint template by use of dry etching or wet etching, and accordingly, to form a first bump 610 between two adjacent first etching areas, where the first bump 610 corresponds to the first mask area.

In this step, the first bump 610 may be directly configured to form the light transmitting portion in the hollow-out area, and accordingly, a shape of the first bump needs to be consistent with a shape of the light transmitting portion; the first bump 610 may also be used as a support for the imprint pattern, therefore, the imprint pattern needs to be formed on the first bump 610 again. This embodiment does not specifically limit the formation method of the imprint pattern, as long as the imprint pattern can form the light transmitting portion of the hollow-out area.

Figure 8:
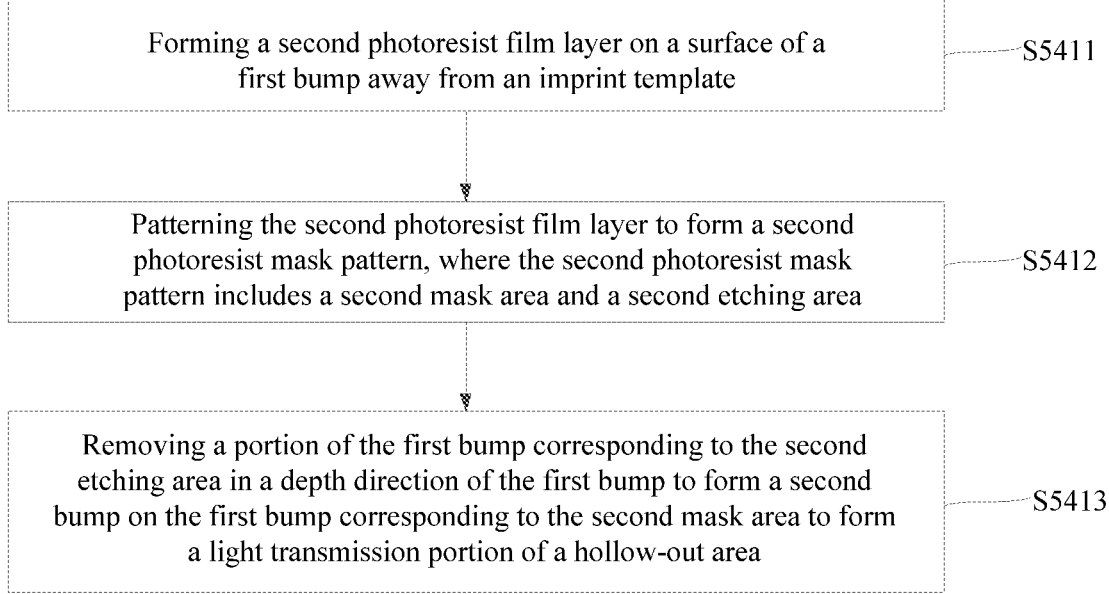
FIG. 8 is Flow Chart 3 of the display screen provided in Embodiment 3 of the present application.

As shown in FIG. 8, the step of forming the imprint pattern on the first bump includes the following.

S5411: forming a second photoresist film layer on a surface of the first bump away from the imprint template.

The second photoresist film layer may be formed on the first bump by use of a coating-curing process, an ink jet printing process or a deposition process, that is, the second photoresist film layer covers a lower surface of the first bump.

S5412: patterning the second photoresist film layer to form a second photoresist mask pattern, where the second photoresist mask pattern includes a second mask area and a second etching area.

The second photoresist film layer is patterned to form the second photoresist mask pattern by a patterning processing mode such as masking, exposing, developing, etching, etc.

S5413: removing a portion of the first bump corresponding to the second etching area in a depth direction of the first bump to form a second bump on the first bump corresponding to the second mask area to form the light transmission portion of the hollow-out area.

Specifically, the portion of the first bump 610 corresponding to the second etching area in the depth direction of the first bump is removed by use of dry etching or wet etching, and accordingly, a second bump 620 located between two adjacent second etching areas is formed, and the second bump 620 corresponds to the second mask area. Then, the second mask area located on the second bump is removed by cleaning, etc., and a pattern of an area of the second bump 620 corresponding to the second mask area constitutes the imprint pattern for forming the light transmitting portion.

It is to be noted that the technical solutions recorded in the above embodiments involves forming the first bump on the imprint template first, then forming the second bump on the first bump, and finally forming the imprint pattern on the second bump. However, the way of forming the imprint pattern is not limited to the above way. For example, the second bump may be formed on the imprint template first, the imprint pattern is formed on the second bump, and the first bump is finally formed on the imprint template by the mask etching.

Continuing to refer to FIG. 7, in some embodiments, after the step of removing the portion of the first bump corresponding to the second etching area in the depth direction of the first bump to form the second bump on the first bump corresponding to the second mask area, the step further includes the following.

S550: providing a pressure treater with an output connected to the imprint template, and supplying pressure to the imprint template to allow the imprint pattern of the imprint template and the cathode layer corresponding to the pixel definition layer to form a cold welding bonding.

An apparatus installed with an imprint template is provided, a display screen is fixed on the apparatus installed with the imprint template, the apparatus is used to apply a certain pressure to the imprint template, and drive the imprint template to move along a direction perpendicular to the display screen, so that the imprint template is pressed on the cathode layer. A certain pressure is applied to the cathode layer by the imprint template, so that the imprint template and the cathode layer form a cold welding bonding, and the cathode layer corresponding to the imprint template and the cathode layer not corresponding to the imprint template are separated.

S560: removing the imprint template, where the imprint template peels off the partial area of the cathode layer corresponding to the pixel definition layer, to form a light transmitting portion of the hollow-out area on the cathode layer corresponding to the pixel definition layer.

What is claimed is:

1. A display screen, comprising: an array substrate, an anode layer, a light-emitting layer and a cathode layer which are stacked in sequence;

the light-emitting layer comprises a plurality of light-emitting units and a pixel definition layer separating the light-emitting units from each other, wherein the pixel definition layer is a transparent layer;

the cathode layer is provided with a hollow-out area corresponding to the pixel definition layer, the hollow-out area has a semitransparent portion and a light transmitting portion penetrating through the cathode layer, and the light transmitting portion is configured for light emitted to a photosensitive element to pass through, and the semitransparent portion is configured to prevent diffraction generated when the light emitted to the photosensitive element passes through the hollow-out area;

wherein the light transmitting portion comprises a plurality of through holes penetrating through the cathode layer, and the plurality of through holes are irregularly arranged in the hollow-out area;

the semitransparent portion is formed between the through holes;

a projection area of the hollow-out area on the pixel definition layer is equal to or smaller than a projection area of the pixel definition layer;

the hollow-out area is arranged in one row, in one column or in an array, and a pattern of each hollowed-out area is consistent.

2. The display screen according to claim 1, wherein the through holes are slits penetrating through the cathode layer, and the slits have different widths.

3. The display screen according to claim 1, wherein the semitransparent portion and the cathode layer are made of same material.

4. The display screen according to claim 1, wherein the hollow-out area comprises a plurality of hollow-out subareas disposed at intervals, and each of the hollow-out subareas has the light transmitting portion and the semitransparent portion.

5. A display device, comprising the display screen according to claim 1, and a photosensitive element located below the display screen, wherein the hollow-out area in the display screen corresponds to the photosensitive element.

6. The display device according to claim 5, wherein the light transmitting portion comprises a plurality of through holes penetrating through the cathode layer, and the plurality of through holes are irregularly arranged in the hollow-out area;

the semitransparent portion is formed between the through holes.

7. The display device according to claim 6, wherein the through holes are slits penetrating through the cathode layer, and the slits have different widths.

8. The display device according to claim 5, wherein the semitransparent portion and the cathode layer are made of same material.

\* \* \* \* \*